United States Patent [19]

Basile

[11] Patent Number: 4,583,054
[45] Date of Patent: Apr. 15, 1986

[54] FREQUENCY TIME STANDARD FAILURE MONITOR

[75] Inventor: Philip C. Basile, Gloucester County, N.J.

[73] Assignee: RCA Corporation, Princeton, N.J.

[21] Appl. No.: 670,620

[22] Filed: Nov. 13, 1984

[51] Int. Cl.$^4$ .................. H03L 7/00; H03B 28/00
[52] U.S. Cl. ........................ 331/2; 331/14; 331/17; 331/49; 331/DIG. 2
[58] Field of Search .......... 331/2, 14, 17, 49, DIG. 2; 328/155

[56] References Cited

U.S. PATENT DOCUMENTS 4,330,854  5/1982  Zeitraeg ................ 328/155 X
4,521,745  6/1985  Falconer ................ 331/49

*Primary Examiner*—Eugene R. LaRoche
*Assistant Examiner*—D. C. Mis

*Attorney, Agent, or Firm*—Joseph S. Tripoli; Robert L. Troike; Christopher L. Maginniss

[57] ABSTRACT

A frequency time standard monitoring system includes three highly accurate standards of substantially identical frequency. These three standards are compared in pairs by three monitoring apparatus. Each such apparatus includes a fine window detector for determining the phase relationship between the two applied frequency standard clock signals, and a phase shifter responsive to the fine window detector for shifting the phase of one of the signals until the signals are phase aligned. When this occurs, the fine window detector is disabled and a coarse window detector monitors the two clock signals to ensure that the clocks do not drift beyond tolerable limits. The output signal of the coarse window detector is applied, along with the corresponding signals from the other two monitoring apparatus, to a select logic which determines which standard should be on-line in the event of a fault detection.

13 Claims, 1 Drawing Figure

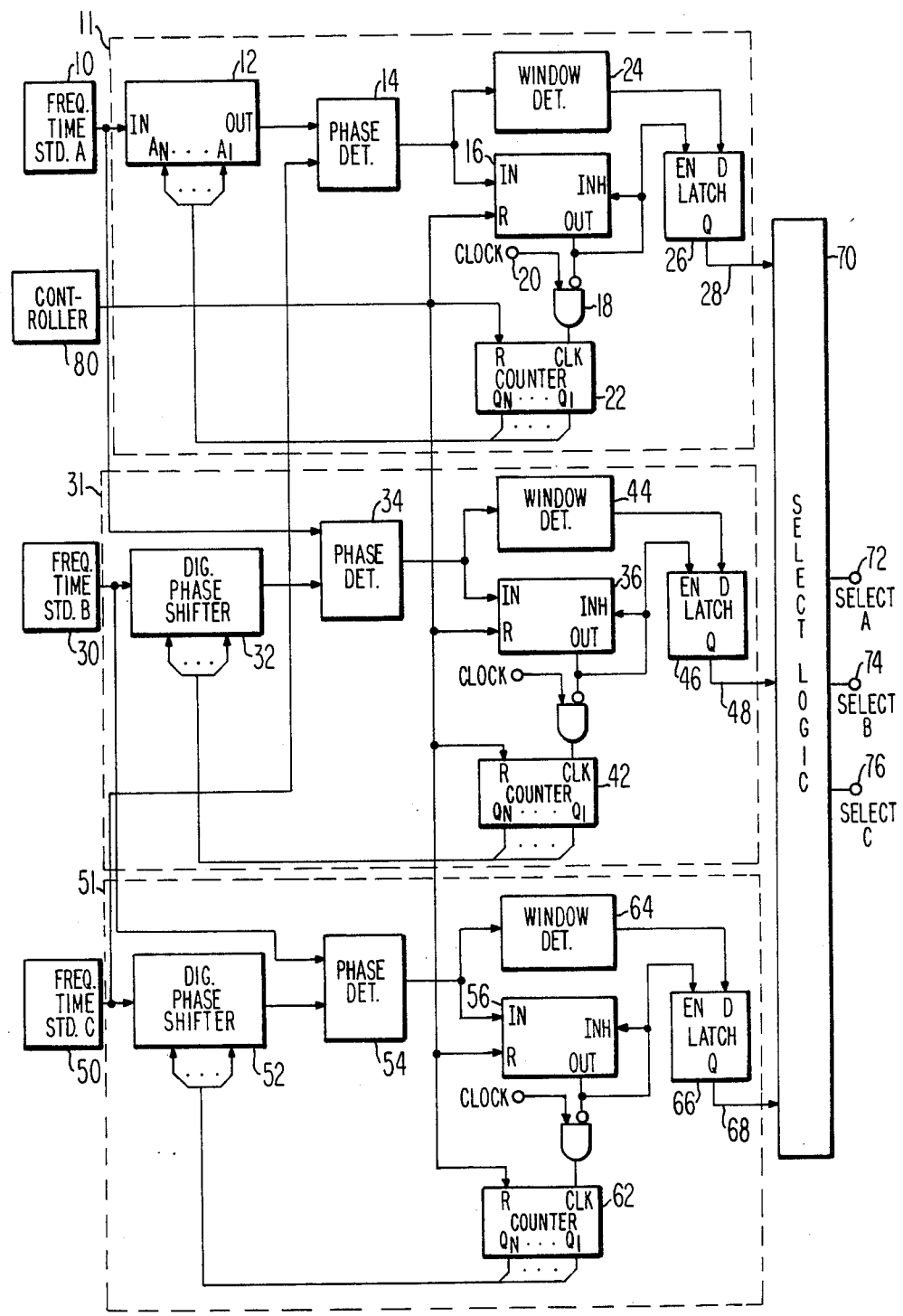

FREQUENCY TIME STANDARD FAILURE MONITOR

This invention relates generally to frequency time standards and, more particularly, to an apparatus for quickly determining when a frequency time standard has failed or has fallen out of tolerable limits.

Highly accurate frequency time standards are vital to the operation of equipment within an exterior communications environment. These frequency time standards allow synchronization between modulating and demodulating equipment and provide highly accurate radio frequency receiver reception.

In recent years, the development of atomic clocks has provided the communications industry with extremely accurate frequency time standards. In particular, the cesium clock, in which the atomic process involves a transition in the precession axis of the outer electron of the cesium atom, provides accuracy to less than one part in ten billion ($10^{10}$). So unvarying, in fact, is this process that is has been made the definition of the second.

With the development of the highly accurate atomic clocks has come a generation of communications equipment which is dependent on that accuracy. As an example, there are synchronization systems in which the key variable for demodulating messages changes according to the time of day. Maintaining a precise time of day in a remote station over a period of a number of months would have been impossible using crystal oscillator clocks; however, time of day accuracy is easily maintained with atomic clocks.

With the development of communications equipment dependent on the accuracy of these atomic time standards, has come the need to monitor these standards for accurate operation. The greatest accuracy to which a frequency time standard can be measured is determined by the frequency time standard used to perform the measurement. However, since the standard to be measured is of the highest degree of accuracy attainable, a similar standard of equal accuracy must be used to perform the measurement. When a failure occurs, it is difficult to determine which frequency time standard is not functioning properly, the standard in use or the measurement standard. Therefore, a third standard of accuracy equal to the other two must be used, and a majority decision among the three frequency time standards must be made to determine the faulty one.

One widely used method for measuring frequency accuracy among three standards involves counting down the three clock signals to one pulse per minute and comparing the leading edge pulse timing among the three references. The amount of pulse timing measurement error difference among the leading edges at one pulse per minute will determine the degree of accuracy to which the standards can be measured. For example, if the uncertainty in leading edge time difference due to phase differences between the standard clock signals and rise times of the measuring apparatus components is one microsecond, then a 5 MHz frequency time standard can be measured to an accuracy of no better than 1.6 parts in $10^8$.

There are many disadvantages associated with this type of measurement. A first disadvantage relates to the measuring accuracy. As previously stated, this method can be expected to provide measurement accuracies of 1.6 parts in $10^8$. However, the increased accuracy of frequency time standards in use today, as well as the dependence of radio and synchronization demodulation equipment on that accuracy, requires that the tolerances be held to better than one part in $10^8$, and in some instances as tight as one part in $10^{10}$.

Another disadvantage of the prior art measuring system is its inability to detect short-term RMS frequency jitter, because the one minute measuring period tends to average all jitter occurring during that interval. Nevertheless, frequency jitter in a time standard should be treated as a fault as it may very likely cause loss of synchronization lock and also create unwanted receiver noise in a radio.

A third disadvantage of the prior art measuring system is its inability to report fault conditions on a real-time basis. Since the measuring period is one minute, the mean time to report a failure is one-half minute. In the event of a catastrophic failure of the on-line standard, the prior art measuring system might not report the failure until serious deleterious effects had taken place in communications. Obviously, a frequency time standard monitoring system which provides virtually instantaneous reporting of a fault condition is superior to one which provides that information an average of one-half minute later.

In accordance with the principles of the present invention an apparatus is disclosed for detecting phase drift between the output signals of two clock sources of substantially identical frequencies. The apparatus comprises means for providing a selectable delay to the first of the two clock signals such that the delayed first clock signal is in virtual phase alignment with the second clock signal. The apparatus further comprises means for providing a control signal upon the initial occurrence of the virtual phase alignment of the delayed first clock signal and the second clock signal, the control signal fixing the selectable delay. Finally, the apparatus comprises means enabled by the control signal for providing a fault indication signal when the phase difference between the delayed first clock signal and the second clock signal exceeds a predetermined value.

In the drawing:

The sole FIG. illustrates in detailed block diagram form the preferred embodiment of the present invention.

Referring to the FIGURE, there is shown the frequency time standard monitoring system of the present invention. Frequency time standard A (FTS-A) 10 is measured against frequency time standard B (FTS-B) 30 by the elements 32–46, comprising monitoring apparatus 31. FTS-B 30 is measured against frequency time standard C (FTS-C) 50 by the elements 52–66, comprising monitoring apparatus 51. FTS-C 50 is measured against FTS-A 10 by the elements 12–26, comprising monitoring apparatus 11. The output signals of monitoring apparatus 11, 31 and 51, carried, respectively, on signal leads 28, 48 and 68, are coupled to select logic 70 which determines, via signals applied to output terminals 72, 74 and 76, the proper frequency time standard to function as the on-line device.

The detailed description of the system shown in the FIGURE will focus on only one of the three monitoring apparatus, as they are identical in form and operation. Considering monitoring apparatus 11, which measures FTS-A 10 against FTS-C 50, the clock signal output of FTS-A 10, which in the present example typically operates at a 5 MHz rate, is applied to digital phase shifter 12 which delays the transmission of its input signal according to the state of the digital control signals applied to control input terminals $A_L \ldots A_N$.

Digital phase shifter 12 typically comprises a plurality of delay elements which are selectable so as to provide a selected amount of delay. In the present example, there are eight digital control inputs to phase shifter 12. Thus, $2^8 = 256$ distinct delays may be selected. If the maximum delay through phase shifter 12 is made to equal one full cycle of an input clock signal having frequency 5 MHz, then the finest increment of delay will be 0.78 nanoseconds, which represents $360/256 = 1.4°$ of delay. It is therefore seen that the digital phase shifter 12 of the present example can adjust the phase of a 5 MHz clock in increments of 1.4°.

The output signal of digital phase shifter 12 is applied to a first input of phase detector 14, while the clock signal output of FTS-C 50 is coupled to the second input. Phase detector 14 compares the phase relationship of its two input signals and generates a dc voltage which is proportional to the phase difference over a range of 0° to 360°, and repeats after each 360° interval.

The dc level generated by phase detector 14 is applied to coarse window detector 24 and to fine window detector 16. Fine window detector 16, also referred to as a zero crossing detector, monitors at its IN input terminal the output signal of phase detector 14. In this example, while the dc voltage level of this signal is not zero (or very close thereto), the signal provided at the OUT output terminal is a logic low. When the level of the dc voltage applied to the IN terminal is sufficiently close to zero, the signal at the OUT terminal goes to a logic high which, via its connection to the INH (inhibit) input terminal, locks out any further changes in the output signal of detector 16 until a positive signal pulse is received at the R (reset) input terminal.

Coarse window detector 24 monitors the output signal of phase detector 14. In this example, detector 24 provides a logic low output as long as the dc voltage level provided by phase detector 14 remains within a preselected window; otherwise, the output signal of detector 24 goes to a high logic level. As may be inferred, the window of detector 24 is wider than the window of detector 16, i.e., detector 24 has a wider range of tolerable voltage levels of the signal provided by phase detector 14.

Window detectors are well known in the art and do not need to be described in detail herein. The additional logic features in detector 16, namely the inhibit and reset functions, are readily implemented by one skilled in the art.

The output signal of detector 16 is coupled to a first input of gate 18. The second input of gate 18 is coupled to a clock signal, CLOCK, which, in this example, typically has a frequency of 5 KHz, or approximately one-thousandth the frequency of the signal provided by FTS-A 10. Gate 18 is configured so as to enable the CLOCK signal, applied at terminal 20, through to counter 22 only when the output signal from detector 16 is at a logic low level.

Counter 22 is a digital counter having, in the present example, eight binary outputs to provide 256 distinct counts to select the 256 possible delays in digital phase shifter 12. The binary count appearing at the $Q_L \ldots Q_N$ output terminals is incremented by one for each occurrence of a clock pulse applied at the CLK input terminal of counter 22. A positive signal pulse applied at the reset (R) input terminal of counter 22 causes the count to be reset to zero.

The output signal of coarse window detector 24 is applied to the data (D) input of latch 26. The output signal of fine window detector 16 is coupled to the enable (EN) input of latch 26. The latter signal, when in a logic high state, enables the output signal of window detector 24 onto signal lead 28 where it is coupled to select logic 70. When the enable signal goes low, the current state of the latch output signal is held until the enable signal goes high again.

Controller 80, coupled to the R input of each of the three fine window detectors 16, 36, and 56, and to the R input of each of the three counters 22, 42, and 62, provides pulses of a reset signal to those devices at times to be discussed with regard to the operation of the monitoring system. Controller 80 may be a microprocessor, wherein the reset pulse generation is just one of many functions which it performs.

The description of the operation of the present invention will be basically limited to that of monitoring apparatus 11, as each of the three monitoring apparatus 11, 31 and 51 performs a similar function. Before actual monitoring begins, there is an initialization process which starts when controller 80 generates a positive pulse which resets fine window detector 16 and which resets counter 22 to zero. At this time it may be assumed that FTS-A 10 and FTS-C 50 are oscillating at very close to the same frequency, although their phase relationship is undetermined. Since the count of counter 22 has been reset to zero, phase shifter 12 provides no delay to the clock signal from FTS-A 10, and the two clock signals (from FTS-A 10 and FTS-C 50) are compared by phase detector 14. Since it is improbable that the two clocks are in phase, detector 14 generates a dc voltage level which is detected by fine window detector 16. This causes the level of the output signal of detector 16 to become a logic low, thus enabling the CLOCK signal at terminal 20 through gate 18, onto the CLK input of counter 22.

Counter 22 responds to the clock pulses at its CLK input by incrementing the binary count at its output terminals $Q_L \ldots Q_N$, which, in correspondence incrementally increases the delay of the clock signal from FTS-A 10 through phase shifter 12. There is provided a sufficient amount of time for phase detector 14 to respond to the phase change of the FTS-A 10 clock signal, since, in this example, the signal which causes counter 22 to increment pulses occurs only once per thousand cycles of the clock signals being monitored.

Eventually, the phase of the FTS-A 10 clock signal is shifted such that the dc voltage level of the output of phase detector 14 is substantially zero, and the digital signal at the output of fine detector 16 becomes a logic high level. This high level inhibits the clock signal from passing through gate 18, the current count is frozen in counter 22, and the phase delay provided by phase shifter 12 is similarly frozen. The low-to-high transition at the output of detector 16 also serves to inhibit any changes of that detector until the next occurrence of the reset pulse.

This completes the initialization process of monitoring apparatus 11, which has brought the clock signals of FTS-A 10 and FTS-C 50 into phase alignment by successive shifts of the phase of the FTS-A 10 signal. Using the values of the present example, the worst-case time for accomplishing this initialization process is approximately 50 milliseconds.

The monitoring process now begins. Because coarse window detector 24 was defined as having a greater threshold of tolerable values of the output level of phase detector 14 than does fine window detector 16, it must follow that if the output signal level of detector 14 is within the window of detector 16, it must then also be within the window of detector 24. Since detector 16 is inhibited at the close of the initialization process only detector 24 monitors the output of phase detector 14 during the monitoring process.

At the close of the initialization process, the output signal of detector 16 additionally enables latch 26 so that the status of window detector 24 is coupled through latch 26 via signal lead 28 to select logic 70. So long as the clock signals of FTS-A 10 and FTS-C 50 remain relatively close in phase, the output signal of detector 24 stays low, and the signal applied to select logic 70 on lead 28 indicates that no fault condition has been detected. When one of the standard clocks drifts such that a phase shift occurs which is out of the tolerable range of detector 24, a high logic level signal appears on lead 28 indicating a fault condition between the clocks of FTS-A 10 and FTS-C 50. The data inputs of latches 26, 46 and 66 are disabled during the initialization process so that the previous fault condition is continually provided to select logic 70 during this process.

There are many ways in which select logic 70 may be configured to perform its task. For example, it might respond to a first positive-going signal from among signal leads 28, 48 and 68 to select the frequency standard not tested by that signal lead to be the on-line standard. That is, it would select FTS-B 30 if signal lead 28 provided a positive-going signal, it would select FTS-C 50 if signal lead 48 provided a positive-going signal, or it would select FTS-A 10 if signal lead 68 provided a positive-going signal. Following selection resulting from a fault indication, it would be appropriate for select logic 70 to lock out all further changes of on-line standard until the next occurrence of the reset pulse signal from controller 80.

It is unreasonable to assume that this monitoring process could operate for any significant amount of time without detecting a fault condition, due to inter alia tolerable drift of the frequency time standards 10, 30 and 50, and drift in phase shifters 12, 32 and 52 and phase detectors 14, 34 and 54. Therefore, the system is periodically reinitialized to realign the phase of the frequency time standards 10, 30 and 50 by fine window detectors 16, 36 and 56. The period between reinitializations must be such that a worst-case tolerable drift by any two of the frequency time standards would not generate a fault condition. In the present example using typical frequency time standards, reinitialization might typically take place from once per second to once every several hours, depending on the accuracy to be measured.

In the usual case, coarse window detectors 24, 44 and 64 are adjustable as to threshold. In the present example, a tolerable phase shift between the two standards being measured would generate determinable dc voltage levels out of phase shifters 14, 34 and 54. These values would be used, respectively, to set the thresholds of detectors 24, 44 and 64.

What is claimed is:

1. An apparatus for detecting phase drift between the output signals of two clock sources of substantially identical frequencies, said apparatus comprising:

means for providing a selectable delay to a first of said two clock signals such that said delayed first signal is in virtual phase alignment with the second of said two clock signals;

means for initiating a control signal upon an occurrence of said virtual phase alignment of said delayed first clock signal and said second clock signal, said control signal fixing said selectable delay; and means enabled by said control signal for providing a fault indication signal when the phase difference between said delayed first clock signal and said second clock signal exceeds a first predetermined value, said means for initiating a control signal including first detector means for detecting when the phase angle difference between said delayed first clock signal and said second clock signal exceeds a second predetermined value.

2. The apparatus according to claim 1 wherein said means for providing a selectable delay includes means for providing a source of low frequency clock signals and counter means for counting at the frequency rate of said low frequency clock signal, said counter means being inhibited by said control signal.

3. The apparatus according to claim 2 wherein said means for providing a selectable delay further includes a digital phase shifter responsive to the output signal of said counter means for selecting said delay.

4. The apparatus according to claim 1 wherein said means for providing a fault indication signal includes second detector means for detecting when the phase angle difference between said delayed first clock signal and said second clock signal exceeds said first predetermined value, said first predetermined value being greater than said second predetermined value.

5. A frequency time standard monitoring system comprising:

first and second clock sources for generating output signals of substantially identical frequencies;

means for providing a selectable delay to said output signal of said first clock source such that said delayed first clock signal is in virtual phase alignment with said output signal of said second clock source;

means for initiating a control signal upon an occurrence of said virtual phase alignment of said delayed first clock signal and said second clock signal, said control signal fixing said selectable delay; and means enabled by said control signal for providing a fault indication signal when the phase difference between said delayed first clock signal and said second clock signal exceeds a first predetermined value, said means for initiating a control signal including first detector means for detecting when the phase angle difference between said delayed first clock signal and said second clock signal exceeds a second predetermined value.

6. The system according to claim 5 wherein said means for providing a selectable delay includes means for providing a source of low frequency clock signals and counter means for counting at the frequency rate of said low frequency clock signal, said counter means being inhibited by said control signal.

7. The system according to claim 6 wherein said means for providing a selectable delay further includes a digital phase shifter responsive to the output signal of said counter means for selecting said delay.

8. The system according to claim 5 wherein said means for providing a fault indication signal includes second detector means for detecting when the phase angle difference between said delayed first clock signal and said second clock signal exceeds said first predetermined value, said first predetermined value being greater than said second predetermined value.

9. A system for providing a highly accurate, frequency time standard, said system comprising:
   three clock sources for generating output signals of substantially identical frequencies;
   three frequency time standard monitoring apparatus, each of said apparatus for monitoring a different pair of said three clock sources, each of said monitoring apparatus including:
   a. means for providing a selectable delay to the output signal of a first one of said pair of clock sources such that said delayed first clock signal is in virtual phase alignment with the output signal of the second one of said pair of clock sources;
   b. means for initiating a control signal upon an occurrence of said virtual phase alignment of said delayed first clock signal and said second clock signal, said control signal fixing said selectable delay; and
   c. means enabled by said control signal for providing a fault indication signal when the phase difference between said delayed first clock signal and said second clock signal exceeds a first predetermined value; and
   means responsive to said fault indication signals provided by said three monitoring apparatus for enabling selection of one of said three clock sources.

10. The system according to claim 9 wherein said means for initiating a control signal includes first detector means for detecting when the phase angle difference between said delayed first clock signal and said second clock signal exceeds a second predetermined value.

11. The system according to claim 9 wherein said means for providing a selectable delay includes means for providing a source of low frequency clock signals and counter means for counting at the frequency rate of said low frequency clock signal, said counter means being inhibited by said control signal.

12. The system according to claim 11 wherein said means for providing a selectable delay further includes a digital phase shifter responsive to the output signal of said counter means for selecting said delay.

13. The system according to claim 10 wherein said means for providing a fault indication signal includes second detector means for detecting when the phase angle difference between said delayed first clock signal and said second clock signal exceeds said first predetermined value, said first predetermined value being greater than said second predetermined value.

* * * * *